US011862233B2

(12) United States Patent
Liu et al.

(10) Patent No.: US 11,862,233 B2
(45) Date of Patent: Jan. 2, 2024

(54) SYSTEM AND METHOD FOR DETECTING MISMATCH OF SENSE AMPLIFIER

(71) Applicant: CHANGXIN MEMORY TECHNOLOGIES, INC., Hefei (CN)

(72) Inventors: Dong Liu, Hefei (CN); Tianhao Diwu, Hefei (CN); Xikun Chu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 111 days.

(21) Appl. No.: 17/664,058

(22) Filed: May 19, 2022

(65) Prior Publication Data

US 2023/0145312 A1 May 11, 2023

Related U.S. Application Data

(63) Continuation of application No. PCT/CN2021/136583, filed on Dec. 8, 2021.

(30) Foreign Application Priority Data

Nov. 5, 2021 (CN) .......................... 202111310551.4

(51) Int. Cl.
 G11C 7/12 (2006.01)
 G11C 11/4091 (2006.01)
(52) U.S. Cl.
 CPC ................. G11C 11/4091 (2013.01)
(58) Field of Classification Search
 CPC .................................. G11C 11/4091
 See application file for complete search history.

(56) References Cited

U.S. PATENT DOCUMENTS

| 7,522,463 | B2  |   | 4/2009  | Pelli et al. |
| 8,559,256 | B2  |   | 10/2013 | Kim |
| 9,240,233 | B1  | * | 1/2016  | Hsu ........ G11C 11/419 |
| 2002/0125497 | A1 |   | 9/2002  | Fitzgerald |
| 2008/0304316 | A1 | * | 12/2008 | Mokhlesi ....... G11C 16/26 365/185.2 |
| 2010/0110760 | A1 |   | 5/2010  | Chen et al. |
| 2012/0063252 | A1 | * | 3/2012  | Sharma ............ G11C 7/08 365/207 |

(Continued)

FOREIGN PATENT DOCUMENTS

| CN | 101681667 A | 3/2010 |
| CN | 102779553 A | 11/2012 |

(Continued)

OTHER PUBLICATIONS

International Search Report cited in PCT/CN2021/136583 dated Aug. 8, 2022, 8 pages.

*Primary Examiner* — Min Huang
(74) *Attorney, Agent, or Firm* — Cooper Legal Group, LLC

(57) ABSTRACT

The present application relates to the field of semiconductors, in particular, to the field of Dynamic Random Access Memories (DRAMs), and provides a method and system for detecting a mismatch of a sense amplifier. The method creates a sense amplifier by delaying switch-on of a positive channel-metal-oxide-semiconductor (PMOS) transistor or a negative channel-metal-oxide-semiconductor (NMOS) transistor in the sense amplifier and shortening a row precharge command period (tRP).

13 Claims, 6 Drawing Sheets

(56) References Cited

U.S. PATENT DOCUMENTS

2012/0287730 A1\* 11/2012 Kim .................. G11C 13/0002
365/189.06
2019/0198507 A1\* 6/2019 Nii ........................... G11C 8/14
2019/0362760 A1\* 11/2019 Lin ...................... G11C 29/028

FOREIGN PATENT DOCUMENTS

| CN | 107845406 A | 3/2018 |
| CN | 112885400 A | 6/2021 |

\* cited by examiner

```
                    ┌─────────────────────────────┐
                    │   Acquire a test data set   │── S11
                    └─────────────────────────────┘
                                  │
                                  ▼
    ┌─────────────────────────────────────────────────────────┐
    │  Convert the test data set into a first voltage         │
    │  difference between a bit line and a reference bit line,│
    │  and input the first voltage difference to a sense      │
    │  amplifier in which a PMOS transistor or an NMOS        │── S12
    │  transistor is delayed to be switched on for precharge  │
    │  for a preset time, with the preset time being less     │
    │  than a standard tRP                                    │
    └─────────────────────────────────────────────────────────┘
                                  │
                                  ▼
    ┌─────────────────────────────────────────────────────────┐
    │  Amplify a second voltage difference between the bit    │
    │  line and the reference bit line obtained after the     │── S13
    │  precharge by the sense amplifier to obtain a voltage   │
    │  difference to be tested                                │
    └─────────────────────────────────────────────────────────┘
                                  │
                                  ▼
    ┌─────────────────────────────────────────────────────────┐
    │  Compare the voltage difference to be tested with a     │
    │  preset voltage difference to be tested, and            │
    │  determine that a mismatch occurs in the sense          │── S13
    │  amplifier if the voltage difference to be tested and   │
    │  the preset voltage difference to be tested are in a    │
    │  same direction                                         │
    └─────────────────────────────────────────────────────────┘
```

NMOS transistors/PMOS transistors switched on normally

SYSTEM AND METHOD FOR DETECTING MISMATCH OF SENSE AMPLIFIER

CROSS-REFERENCE TO RELATED APPLICATIONS

This is a continuation of International Application No. PCT/CN2021/136583, filed on Dec. 8, 2021, which claims the priority to Chinese Patent Application No. 202111310551.4, titled "SYSTEM AND METHOD FOR DETECTING MISMATCH OF SENSE AMPLIFIER" and filed with China National Intellectual Property Administration (CNIPA) on Nov. 5, 2021. The entire contents of International Application No. PCT/CN2021/136583 and Chinese Patent Application No. 202111310551.4 are incorporated herein by reference.

TECHNICAL FIELD

The present application relates to the field of semiconductors, and in particular, to the field of Dynamic Random Access Memories (DRAMs).

BACKGROUND

In a DRAM, a voltage difference between a bit line and a reference bit line may be very small due to a tiny size and very weak drive capability of a memory cell. If such a voltage difference is directly input to an output buffer, logic 0 and logic 1 will not be identified. A sense amplifier is used to amplify the weak voltage difference between the bit line and the reference bit line so that logical data in the memory cell can be identified correctly.

At present, a sense amplifier may be insufficient in anti-interference capability due to differences in manufacturing process. Moreover, if a metal-oxide-semiconductor (MOS) transistor is not switched on at a correct time point when the sense amplifier operates, the sense amplifier may have abnormal inversion and fail to read. In a conventional method of testing a sense amplifier, write-read operations are usually performed on a memory cell with a shortened precharge command period (tRP), and whether there is a mismatch in the sense amplifier may be determined by comparing output results. Since loose restriction is imposed on tRP and some potential failures of a sense amplifier are not prone to exposure for the operating environment of the sense amplifier being not bad enough, existing conventional methods cannot achieve expected detection effects.

SUMMARY

To achieve the above objective, embodiments of the present application provide a method for detecting a mismatch of a sense amplifier, including:

acquiring a test data set;
converting the test data set into a first voltage difference between a bit line and a reference bit line, and inputting the first voltage difference to a sense amplifier in which a positive channel-metal-oxide-semiconductor (PMOS) transistor or a negative channel-metal-oxide-semiconductor (NMOS) transistor is delayed to be switched on for precharge for a preset time, with the preset time being less than a standard precharge command period (tRP);
amplifying a second voltage difference between the bit line and the reference bit line obtained after the precharge by the sense amplifier to obtain a voltage difference to be tested; and
comparing the voltage difference to be tested with a preset voltage difference to be tested, and determining that a mismatch occurs in the sense amplifier if the voltage difference to be tested and the preset voltage difference to be tested are in a same direction.

Embodiments of the present application further provide a system for detecting a mismatch of a sense amplifier, including:

a data acquisition circuit configured to acquire a test data set;
a data conversion circuit configured to convert the test data set into a first voltage difference between a bit line and a reference bit line, input the first voltage difference to a sense amplifier in which a PMOS transistor or an NMOS transistor is delayed to be switched on for precharge for a preset time, with the present time is less than a standard tRP, and amplify a second voltage difference between the bit line and the reference bit line obtained after the precharge by the sense amplifier to obtain a voltage difference to be tested; and
a mismatch detection circuit configured to compare the voltage difference to be tested with a preset voltage difference to be tested, and determine that a mismatch occurs in the sense amplifier if the voltage difference to be tested and the preset voltage difference to be tested are in a same direction.

BRIEF DESCRIPTION OF THE DRAWINGS

FIG. 2 is a flowchart of a method for detecting a mismatch of a sense amplifier according to an alternative embodiment of the present application.

FIG. 3 is a topological graph of test data in a method for detecting a mismatch of a sense amplifier according to an alternative embodiment of the present application.

DETAILED DESCRIPTION

The technical solutions in embodiments of the present application will be described below clearly and completely with reference to the accompanying drawings in the embodiments of the present application. Apparently, the described embodiments are merely some rather than all of the embodiments of the present application. All other embodiments derived from the embodiments disclosed in the present application by those of ordinary skill in the art without creative efforts shall fall within the protection scope of the present application.

Unless otherwise defined, all technical and scientific terms used herein have the same meaning as commonly understood by those skilled in the technical field of the present application. The terms used herein are merely for the purpose of describing specific embodiments, and are not intended to limit the present application. In addition, some terms used throughout the description and the following claims refer to specific elements. It will be appreciated by those skilled in the art that manufacturers may use different names to refer to elements. This document is not intended to distinguish between elements that have different names but the same function. The terms "comprise" and "include" used in the following description and embodiments are all open and thus should be construed as "including but not limited to . . . ". Likewise, the term "connection" is intended to mean indirect or direct electrical connection. Correspondingly, if a device is connected to another device, the connection may be achieved by direct electrical connection or by indirect electrical connection through other device and a connecting piece.

It is to be understood that the terms such as "first" and "second" may be used herein to describe various elements, but these elements are not limited by such terms. Instead, these terms are merely intended to distinguish one element from another. For example, without departing from the scope of disclosure of the present application, a first element may be referred to as a second element, and similarly, a second element may be referred to as a first element.

Figure 1:
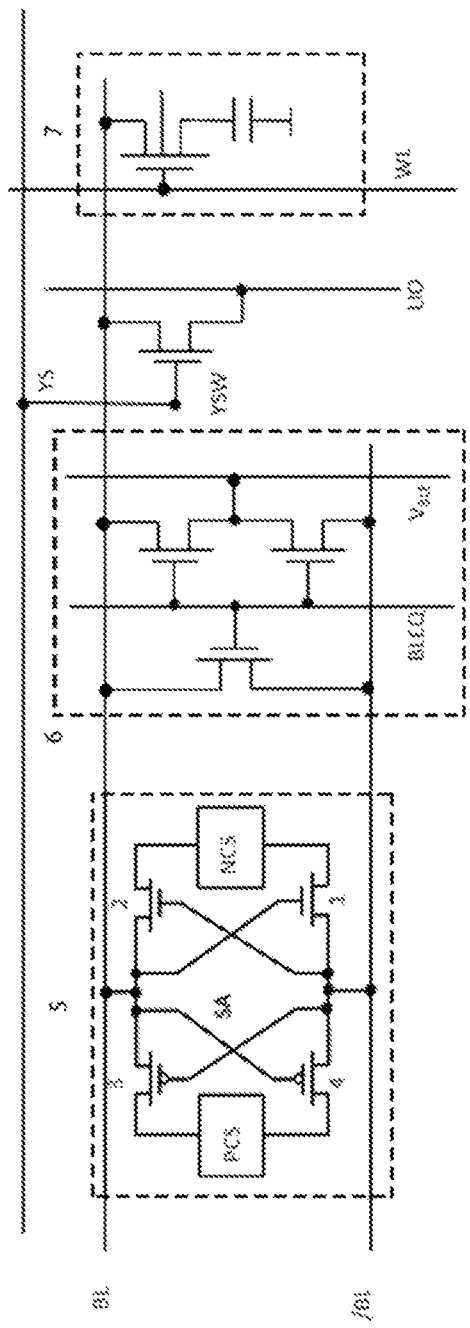
FIG. 1 is an operating circuit diagram of a sense amplifier in a method for detecting a mismatch of a sense amplifier according to an alternative embodiment of the present application.

In one embodiment, FIG. 1 is an operating circuit diagram of a sense amplifier in a method for detecting a mismatch of a sense amplifier according to an alternative embodiment of the present application. The sense amplifier includes a sense-amplifying circuit 5, a precharge circuit 6, and a memory cell 7.

The sense-amplifying circuit 5 is composed of a first NMOS transistor 1, a second NMOS transistor 2, a first PMOS transistor 3, a second PMOS transistor 4, a PCS power source, and an NCS power source. A drain of the first PMOS transistor 3 and a gate of the second PMOS transistor 4 are both connected to a bit line BL, while a gate of the first PMOS transistor 3 and a drain of the second PMOS transistor 4 are both connected to a reference bit line/BL and sources of the first PMOS transistor 3 and the second PMOS transistor 4 are both connected to the PCS power source. A gate of the first NMOS transistor 1 and a drain of the second NMOS transistor 2 are both connected to the bit line BL, while a drain of the first NMOS transistor 1 and a gate of the second NMOS transistor 2 are both connected to the reference bit line/BL and sources of the first NMOS transistor 1 and the second NMOS transistor 2 are both connected to the NCS power source. Thus, the sense-amplifying circuit 5 is formed by the first NMOS transistor 1, the second NMOS transistor 2, the first PMOS transistor 3 and the second PMOS transistor 4 that are cross-coupled with one another, where the first NMOS transistor 1 and the first PMOS transistor 3, and the second NMOS transistor 2 and the second PMOS transistor 4 form CMOS inverters, respectively.

In this embodiment, the PCS power source is configured to connect the source of the first PMOS transistor 3 to a power voltage VDD in response to a pull-up control signal. The NCS power source is configured to ground the source of the first NMOS transistor 1 in response to a pull-down control signal.

In this embodiment, after a voltage difference between the bit line BL and the reference bit line/BL reaches a certain value, the NCS power source and the PCS power source are turned on such that the first NMOS transistor 1, the second NMOS transistor 2, the first PMOS transistor 3 and the second PMOS transistor 4 form two cross-coupled inverter positive feedback circuits to rapidly amplify the voltage difference between the bit line BL and the reference bit line/BL. Thus, the amplification of the voltage difference between the bit line BL and the reference bit line/BL by the sense-amplifying circuit 5 is completed.

In this embodiment, the PCS power source may include a pull-up PMOS transistor, and the NCS power source may include a pull-down NMOS transistor. However, the PCS power source may also be implemented by using an NMOS transistor, while the NCS power source may also be implemented by using a PMOS transistor, and the PCS power source or the NCS power source may include more than one device or a plurality of devices that are controlled by different control signals to be switched on or off, which will not be limited in the present application.

The precharge circuit 6 is composed of three NMOS transistors and connected to two output end lines of the sense-amplifying circuit 5. A control terminal of the precharge circuit 6 receives an equalization control signal EQ. The precharge circuit 6 may be controlled by the equalization control signal EQ to precharge the bit line BL, the reference bit line/BL and the two output end lines of the sense-amplifying circuit 5, and may charge the bit line BL and the reference bit line/BL to a specified precharge voltage VBLP. In case of realization of the same or similar circuit functions, the precharge circuit 6 provided in this exemplary embodiment may also be replaced by any other circuit, which will not be particularly limited in this exemplary embodiment.

In this embodiment, YS refers to a bit line selection signal and may be, for example, provided by a single NMOS transistor that has a gate connected to the bit line selection signal YS and a source connected to LIO. YSW refers to a gate voltage difference for controlling the NMOS transistor to be switched on.

In this embodiment, the memory cell 7 includes a single drive transistor and a memory capacitor. The drive transistor has a gate connected to a word line, a drain connected to the bit line BL, and a source connected to a ground wire by means of the memory capacitor. When the charge on the memory capacitor is emptied (i.e., discharge), storage data thereof is "0". After the memory capacitor is charged, the memory capacitor is usually charged to an operating voltage VDD and storage data thereof is "1". The word line WL controls the drive transistor to be switched on or off, thereby controlling charge or discharge of the memory capacitor to realize write-in or read-out of data.

Figures 2, 3:
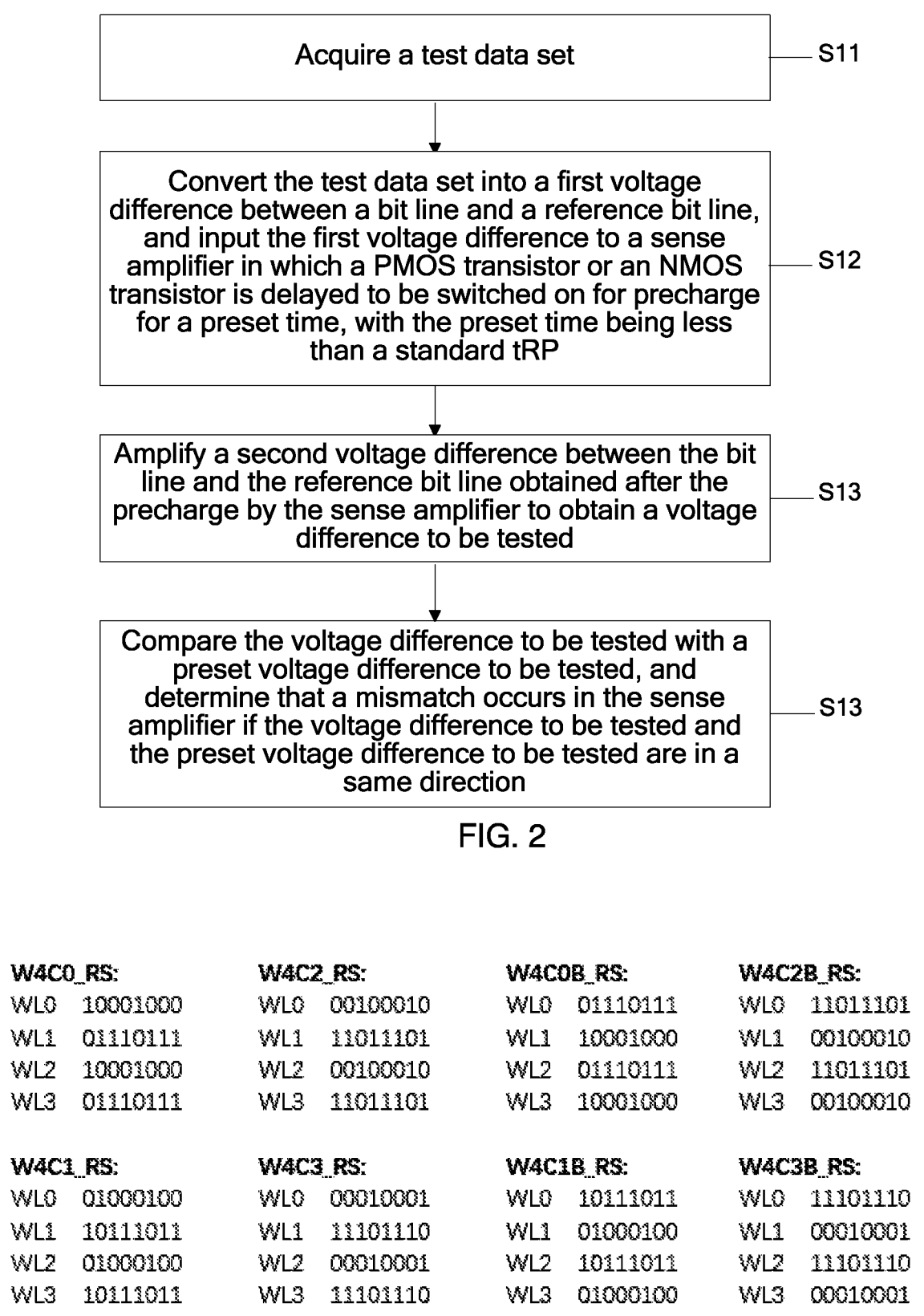

In one embodiment, FIG. 2 is a flowchart of a method for detecting a mismatch of a sense amplifier according to an alternative embodiment of the present application. The method includes:

S11, acquire a test data set;

S12, convert the test data set into a first voltage difference between a bit line and a reference bit line, and input the first voltage difference to a sense amplifier in which a PMOS transistor or an NMOS transistor is delayed to be switched on for precharge for a preset time, with the preset time being less than a standard tRP;

S13, amplify a second voltage difference between the bit line and the reference bit line obtained after the precharge by the sense amplifier to obtain a voltage difference to be tested; and S14, compare the voltage difference to be tested with a preset voltage difference to be tested, and determine that a mismatch occurs in the sense amplifier if the voltage difference to be tested and the preset voltage difference to be tested are in a same direction.

Specifically, when the sense amplifier in which a PMOS transistor or an NMOS transistor is delayed to be switched on in step S12 corresponds to the sense-amplifying circuit 5 in FIG. 1, delaying the PMOS transistor means simultaneously delaying the first PMOS transistor 3 and the second PMOS transistor 4, and delaying the NMOS transistor means simultaneously delaying the first NMOS transistor 1 and the second NMOS transistor 2.

After a preset test data set is acquired, the preset test data set is converted into a third voltage difference between the bit line BL and the reference bit line/BL and then input to the sense amplifier with MOS transistors being switched on normally for precharge for the standard tRP. A fourth voltage difference obtained after the precharge is amplified by the sense-amplifying circuit 5 to obtain the preset voltage difference to be tested. The data of the preset test data set is inverse to that of the test data set at the corresponding bit line where the data is written. The MOS transistors refer to the first NMOS transistor 1, the second NMOS transistor 2, the first PMOS transistor 3 and the second PMOS transistor 4 in the sense-amplifying circuit 5 of the sense amplifier.

FIG. 3 is a topological graph of test data sets written in this embodiment, where W4C0_RS, W4C1_RS, W4C2_RS, and W4C3_RS may be used as preset test data sets, and W4C0B_RS, W4C1B_RS, W4C2B_RS, and W4C3B_RS may be used as test data sets. The preset test data sets and the test data sets may be used interchangeably as long as the data of the preset test data sets is inverse to that of the test data sets at the corresponding bit lines where the data is written. The reason for doing so is to create worse test conditions for testing the mismatch of the sense amplifier so that a failure of the sense amplifier can be detected more easily when strict restriction is imposed on tRP.

When the sense amplifier operates, in the memory cell 7, the weak voltage difference between the bit line BL and the reference bit line/BL is used to express "0" or "1" stored in the memory cell 7, which is the first voltage difference. The voltage difference between the bit line BL and the reference bit line/BL may be very small due to the tiny size and very weak drive capability of the memory cell 7. If such a voltage difference is directly input to an output buffer, "0" or "1" in the memory cell 7 will not be identified. Therefore, the voltage difference between the bit line BL and the reference bit line/BL in the memory cell 7 needs to be input to the sense-amplifying circuit 5 for amplification.

Figure 4:
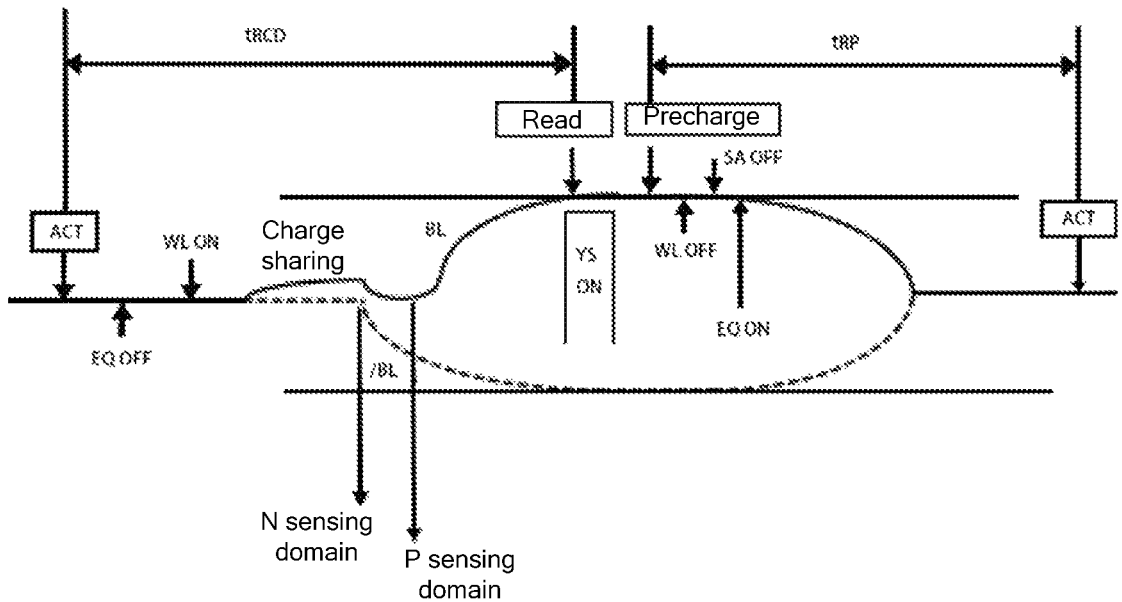
FIG. 4 is a diagram illustrating a complete waveform in a method for detecting a mismatch of a sense amplifier according to an alternative embodiment of the present application.

In this embodiment, FIG. 4 is a diagram illustrating a complete waveform in a method for detecting a mismatch of a sense amplifier according to an alternative embodiment of the present application. Taking performing reading of "1" in last operation and performing reading of "1" in current operation for example, the complete operating process of the sense amplifier is observed by describing changes in voltage difference between the bit line BL and the reference bit line/BL during a single complete operating process of the sense amplifier.

In this embodiment, the tRP represents precharge command period, which is also referred to as a row precharge command period. After a precharge command is given, an effective row address strobe (RAS) command is allowed to be given after a period of time to open a new work row. A delay from RAS to column address strobe (CAS) is represented by tRCD. After the reading of data "1" is completed, the operating process of the sense amplifier further includes a recovery stage. After the reading of "1" is performed, the equalization control signal EQ is switched off, while the word line signal is switched on, and the PCS power source and the NCS power source are turned on. The reference bit line/BL is then let to recover to a high level, and the bit line BL is let to recover to a low level.

In this embodiment, since the last operation is performing reading of "1", the bit line BI is at a high level and the reference bit line/BL is at a low level. The start of the precharge operation is represented by Pre, and at this time, the word line signal is switched off, while the sense-amplifying circuit 5 is switched off (the amplification operation is not performed in case of SA off), and the equalization control signal EQ is switched on to charge the bit line BL and the reference bit line/BL to the precharge voltage VBLP.

After the precharge stage ends, the sense-amplifying circuit 5 is switched on, while the equalization control signal EQ is switched off, and the word line signal is switched on, thereby corresponding the memory capacitor in the corresponding memory cell 7 to perform the precharge operation. Charge sharing is performed between the charge in the memory capacitor and the charge of the bit line BL. Since the data having the value of "1" is stored in the corresponding memory capacitor during this process, the voltage of the bit line BL rises by about 15-20 millivolts during the charge sharing process.

In this process, the NMOS transistors and the PMOS transistors in the sense-amplifying circuit 5 are all switched on normally, where the first NMOS transistor 1, the second NMOS transistor 2, the first PMOS transistor 3 and the second PMOS transistor 4 form the CMOS inverters, respectively. Since reading of "1" is performed at this operation, the voltage difference is mainly amplified by the CMOS inverter formed by the first NMOS transistor 1 and the first PMOS transistor 3 at this time. Thus, the reading of data "1" in the memory cell 7 is completed. If reading of "0" is performed at this operation, the voltage difference is mainly amplified by the CMOS inverter formed by the second NMOS transistor 2 and the second PMOS transistor 4 at this time. Thus, the reading of data "0" in the memory cell 7 is completed.

At present, a sense amplifier manufactured by a different manufacturing process may be insufficient in anti-interference capability. Moreover, if the NMOS transistors or the PMOS transistors in the sense-amplifying circuit 5 are not switched on at a correct time point when the sense amplifier operates, the sense amplifier may have abnormal inversion and fail to read. When testing the sense amplifier by a conventional method, write-read operations are performed on the memory cell 7 with a shortened tRP, and whether there is a mismatch in the sense amplifier is determined by comparing output results. However, since loose restriction is imposed on tRP and some potential failures of a sense amplifier are not prone to exposure for the operating environment of the sense amplifier being not bad enough, the conventional methods cannot achieve expected detection effects.

Figure 5:
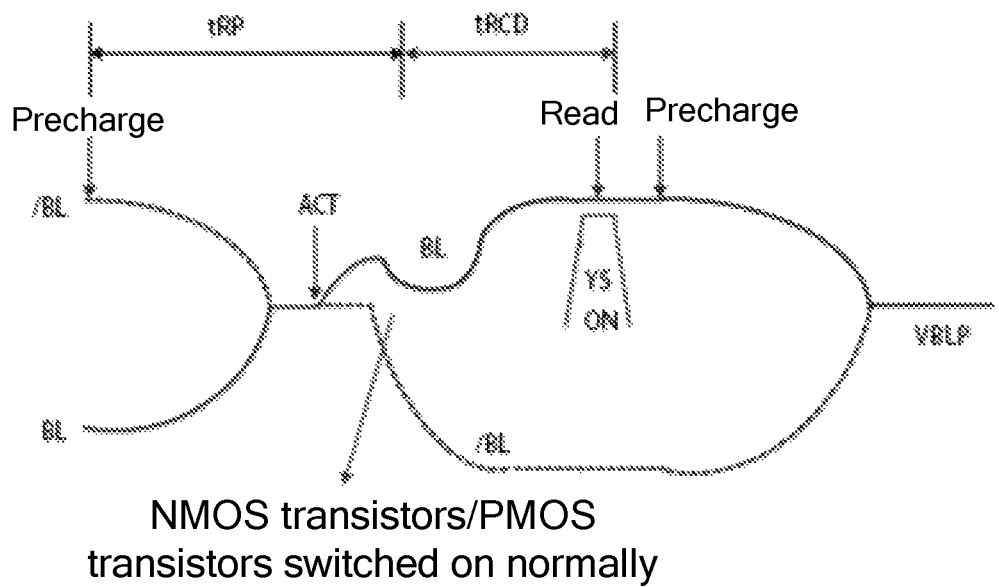
FIG. 5 is a diagram illustrating a waveform of a sense amplifier normally operating at an amplification stage in a method for detecting a mismatch of a sense amplifier according to an alternative embodiment of the present application.

In one embodiment, FIG. 5 is a diagram illustrating a waveform of a sense amplifier normally operating at an amplification stage in a method for detecting a mismatch of a sense amplifier according to an alternative embodiment of the present application. The last operation performed by the sense amplifier is the operation of reading "0", and the current operation is the operation of reading "1".

In this embodiment, the data written by the provided preset test data set to the memory cell 7 is "0", and the data written by the provided test data set to the memory cell 7 is "1". Reading the preset test data set after being written in the memory cell 7 is an operation before reading the test data set after being written in the memory cell 7.

When performing the last operation of reading "0", the memory cell 7 inputs a weak voltage difference between the bit line L and the reference bit line/BL to the sense amplifier, and the weak voltage difference is the third voltage difference at this time. During the tRP, the sense amplifier firstly enters the precharge stage to precharge two bit lines (i.e., the bit line L and the reference bit line/BL) for the standard tRP, pulling the voltages of the two bit lines to the precharge voltage VBLP. The voltage difference between the two bit lines is the fourth voltage difference at this time.

The standard tRP may vary according to specified factory parameters of different models of products from different companies, which will not be particularly limited herein. The preset voltage difference may be amplified and output by the sense-amplifying circuit with the first NMOS transistor 1, the second NMOS transistor 2, the first PMOS transistor 3 and the second PMOS transistor 4 being switched on normally. From the above embodiments, after the recovery stage of the sense amplifier ends, the reference bit line/BL recovers to the high level and the bit line BL recovers to the low level.

Since the last operation performed is reading "0", the reference bit line/BL is at the high level and the bit line BL is at the low level before the sense amplifier is tuned on, and the voltage difference between the two bit lines is the first voltage difference. During the tRP, the sense amplifier firstly enters the precharge stage Pre to precharge two bit lines for the standard tRP, pulling the voltages of the two bit lines to the precharge voltage VBLP. The voltage difference between the two bit lines is the second voltage difference at this time.

After the completion of the precharge, the two precharged bit lines are switched into the sense-amplifying circuit 5 as inputs to enter a first amplification stage, causing the word line signal to be switched on and the voltage of the bit line BL to rise. The first PMOS transistor 3 and the first NMOS transistor 1 are switched on at the preset time, and the second PMOS transistor 4 and the second NMOS transistor 2 are switched off.

Since the first PMOS transistor 3 and the first NMOS transistor 1 form the CMOS inverter, the bit line BL is at a relatively high level at this time. Due to the action of the inverter, the voltage at the output end of the inverter drops continuously at the first amplification stage, that is, the voltage of the reference bit line/BL drops continuously. At the first amplification stage of the sense-amplifying circuit 5, the voltage difference between the bit line BL and the reference bit line/BL will increase significantly, which may be helpful for further amplifying the voltage difference therebetween, thereby increasing the speed of reading data, and also helpful for avoiding data from being amplified improperly.

The sense-amplifying circuit 5 then enters a second amplification stage, and the first NMOS transistor 1, the second NMOS transistor 2, the first PMOS transistor 3 and the second PMOS transistor 4 are all switched on at this time to form a cross-coupled amplification structure.

At this time, the voltage on the bit line BL is higher than that on the reference bit line is/BL, and the first NMOS transistor 1 is switched on at this time, discharging the voltage on the reference bit line/BL to the ground. In addition, the second PMOS transistor 4 is switched on, increasing the voltage on the bit line BL to a Vary voltage.

Thus, with such a cross-coupled amplification structure, a small voltage read from the memory cell 7 from the bit line BL can be amplified to 0 or 1. At this time, the voltage difference output between the two bit lines of the sense-amplifying circuit 5 is the voltage difference to be tested.

Subsequently, the bit line selection signal YS is switched on so that the voltage difference to be tested output by the sense-amplifying circuit 5 is read and data "1" in the memory cell 7 is identified.

According to the embodiments of the present application, the operating environment for the sense amplifier is worsened by shortening the tRP and delaying switch-on of the NMOS transistors or the PMOS transistors so that the sense amplifier having the potentiality of failures due to differences in manufacturing process (where the first NMOS transistor 1, the second NMOS transistor 2, the first PMOS transistor 3 and the second PMOS transistor 4 in the sense-amplifying circuit 5 cannot be switched on time when the memory operates at a high speed) can be detected.

Figure 6:
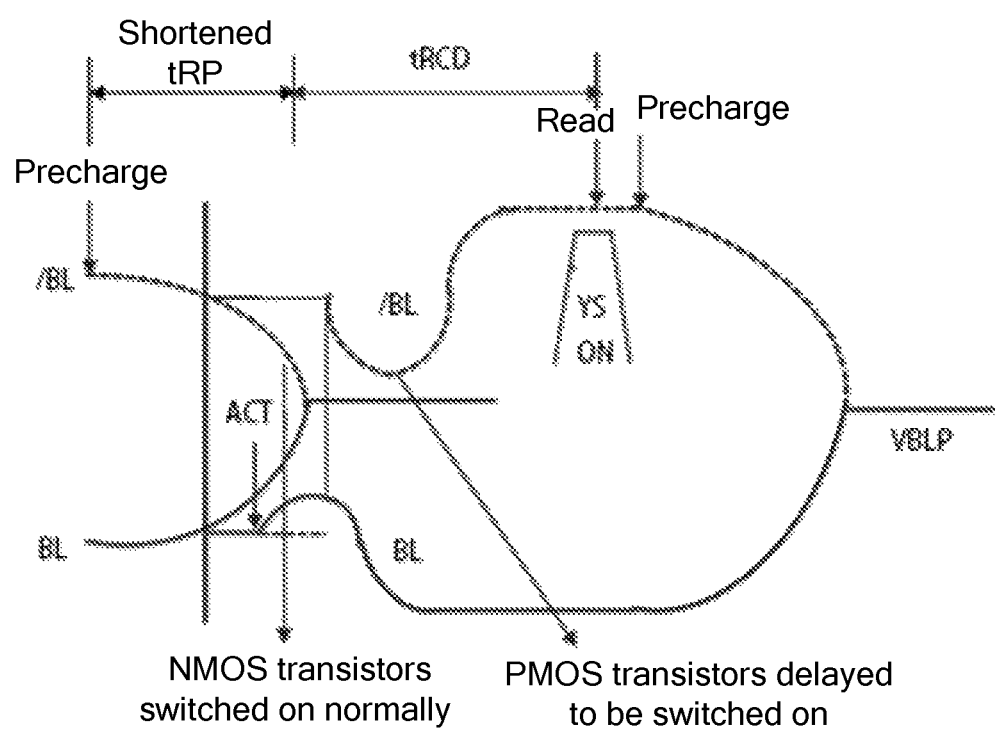
FIG. 6 is a diagram illustrating a waveform of a sense amplifier operating at an amplification stage with shortened tRP and delayed switch-on of a PMOS transistor in a method for detecting a mismatch of a sense amplifier according to an alternative embodiment of the present application.

FIG. 6 is a diagram illustrating a waveform of a sense amplifier operating at the amplification stage with shortened tRP and delayed switch-on of a PMOS transistor in a method for detecting a mismatch of a sense amplifier according to an alternative embodiment of the present application. The last operation performed by the sense amplifier is the operation of reading "0", and the current operation is the operation of reading "1".

Since the last operation performed is reading "0", the reference bit line/BL is at the high level and the bit line BL is at the low level before the sense amplifier is tuned on, and the voltage difference between the two bit lines is the first voltage difference at this time. During the shortened tRP, the sense amplifier firstly enters the precharge stage Pre to precharge two bit lines for a preset time which is less than the standard tRP. Because of the shortened tRP, the precharge circuit 6 fails to pull the voltages of the two bit lines to the precharge voltage VBLP. The voltage difference between two bit lines is the second voltage difference at this time. At this time, the reference bit line/BL is at a relatively high level as compared with the bit line BL.

The voltage difference when the reference bit line/BL is at a relatively high level as compared with the bit line BL is input to the sense-amplifying circuit 5 to enter the first amplification stage, causing the word line signal to be switched on and the potential of the bit line BL to rise. The first NMOS transistor 1 is switched on at the preset time, while the first PMOS transistor 3 is delayed to be switched on, and the second PMOS transistor 4 and the second NMOS transistor 2 are switched off.

The operating environment for the sense amplifier becomes worse, and the voltage of the bit line BL cannot be increased to the high level as compared with the voltage of the reference bit line/BL within a predetermined time.

The sense amplifier then enters the second amplification stage, and the first NMOS transistor 1, the second NMOS transistor 2, the first PMOS transistor 3 and the second PMOS transistor 4 are all switched on at this time to form the cross-coupled amplification structure.

At this time, the voltage on the bit line BL is lower than that on the reference bit line /BL, and the second NMOS transistor 2 is switched on at this time, discharging the voltage on the bit line BL to the ground through the second NMOS transistor 2. In addition, the first PMOS transistor 3 is switched on, increasing the voltage on the reference bit line/BL to the Vary voltage. Abnormal inversion occurs in the sense amplifier. At this time, the voltage difference output between the two bit lines of the sense-amplifying circuit 5 is the voltage difference to be tested.

Subsequently, the bit line selection signal YS is switched on so that the voltage output by the sense amplifier is read, and the data in the memory cell 7 is mistakenly identified as "0".

Thus, after the PMOS transistors are delayed to be switched on, the operating environment for the sense amplifier can be worsened with shortened tRP, causing abnormal inversion in the sense amplifier having the potentiality that the first NMOS transistor 1, the second NMOS transistor 2, the first PMOS transistor 3 and the second PMOS transistor 4 cannot be switched on within the predetermined time. Accordingly, the detection of the mismatching sense amplifier is realized.

In this embodiment, the operating environment of the sense amplifier is worsened by, for example, delaying the switch-on of the PMOS transistors, or by delaying the switch-on of the NMOS transistors, or in other ways, which will not be particularly limited in this exemplary embodiment.

Figure 7:
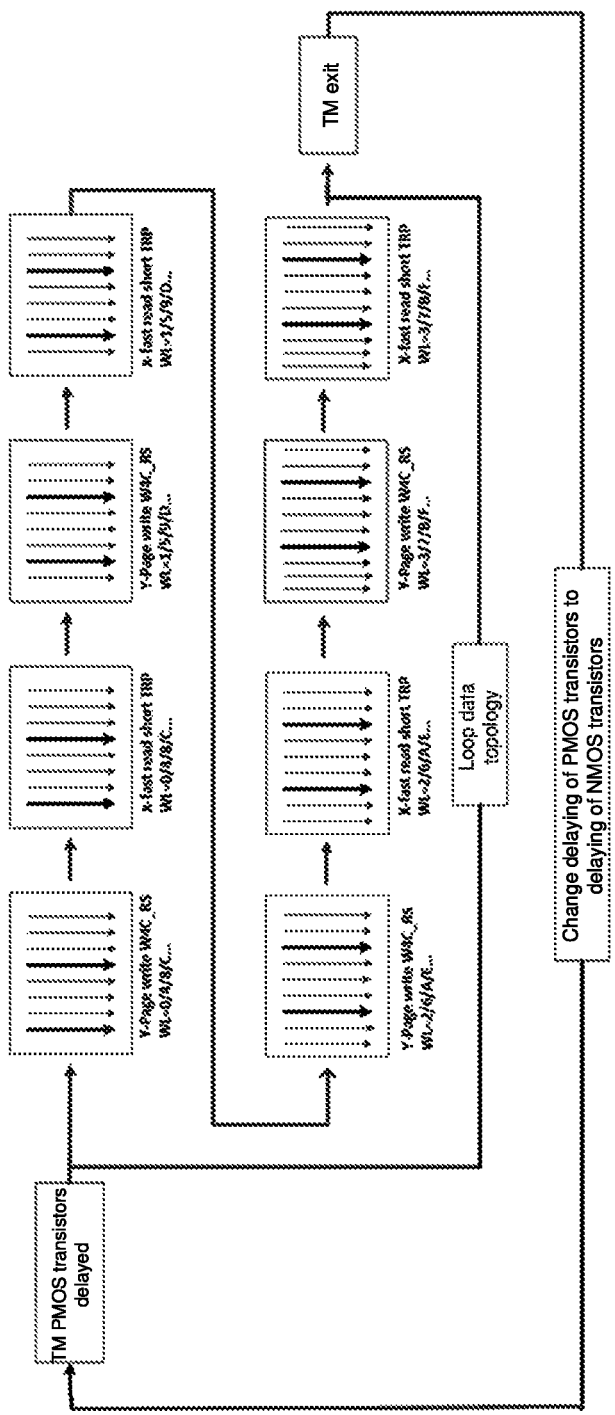
FIG. 7 is a flowchart of a method for detecting a mismatch of a sense amplifier according to an alternative embodiment of the present application.

In one embodiment, FIG. 7 is a flowchart of a method for detecting a mismatch of a sense amplifier according to an alternative embodiment of the present application. In the blocks in FIG. 7, a bold arrow represents writing in this word line, and a non-bold arrow represents not writing in this word line. The specific process is as follows:

Step 1, the first PMOS transistor 3 and the second PMOS transistor 4 are delayed to be switched on.

Step 2, the preset test data set W4C0_RS is written in the word line No. 0/4/8/C . . . in the manner of Y-Page, and with shortened tRP, the word line No. 0/4/8/C . . . is read in the manner of X-Fast.

Step 3, the preset test data set W4C1_RS is written in the word line No. 1/5/9/D . . . in the manner of Y-Page, and with shortened tRP, the word line No. 1/5/9/D . . . is read in the manner of X-Fast.

Step 4, the preset test data set W4C2_RS is written in the word line No. 2/6/NE . . . in the manner of Y-Page, and with shortened tRP, the word line No. 2/6/NE . . . is read in the manner of X-Fast.

Step 5, the preset test data set W4C3_RS is written in the word line No. 3/7/B/F . . . in the manner of Y-Page, and with shortened tRP, the word line No. 3/7/B/F . . . is read in the manner of X-Fast.

Step 6, the preset test data set W4C0B_RS is written in the word line No. 0/4/8/C. . . in the manner of Y-Page, and with shortened tRP, the word line No. 0/4/8/C . . . is read in the manner of X-Fast.

Step 7, the preset test data set W4C1B_RS is written in the word line No. 1/5/9/D . . . in the manner of Y-Page, and with shortened tRP, the word line No. 1/5/9/D . . . is read in the manner of X-Fast.

Step 8, the preset test data set W4C2B_RS is written in the word line No. 2/6/NE . . . in the manner of Y-Page, and with shortened tRP, the word line No. 2/6/A/E . . . is read in the manner of X-Fast.

Step 9, the preset test data set W4C3B_RS is written in the word line No. 3/7/B/F . . . in the manner of Y-Page, and with shortened tRP, the word line No. 3/7/B/F . . . is read in the manner of X-Fast.

Step 10, the test mode exits, and the first PMOS transistor 3 and the second PMOS transistor 4 recover to the normal state.

Step 11, the first NMOS transistor 1 and the second NMOS transistor 2 are delayed to be switched on instead, and steps 2 to 9 are repeated.

In this embodiment, the logical arrangement mode of memory cells 7 is that the location of a memory cell 7 is determined by giving a row address and a column address. However, with the current memory technology, the operations of columns are performed with a burst length (BL), where the burst length is determined by JEDEC standard or may be set freely. That is, a column address of a plurality of bits (such as 8 or 16 bits) are read and written through a single operation, and the data of 0 and 1 is written in or read from each burst length (for example, if the address of location is row 0 and the burst length is 8 bits, the first 8 numeral values of the memory cell 7 are simultaneously written in the position of row 0 and column 0, and the 9th to 16th numeral values of the memory cell 7 are written in the second burst length, from which writing is continued. When the memory location of one row is fully written, the test software re-locates the address of next row and continues the operation of the last row until the whole disk is written with data. The operations of reading data are performed similarly). In other words, in this embodiment, the test data is re-written in the memory location of each row. For example, if the test data is 1010101010101010, 10101010 is written in the first row, and 10101010 is written also in the second row.

In addition, for writing at a preset interval, for example, at a preset interval of 1, when the test data is written in addresses such as column 0, column 2 and column 4 in a row on the memory cell 7, the test data is not written in addresses such as column 1 and column 3 in a row on the memory cell 7, and the interval between column 0 and column 2 in a row on the memory cell 7 is the preset interval, namely 1. If the preset interval is 2, when the test data is written in addresses such as column 0, column 3 and column 6 in a row on the memory cell 7, the test data is not written in addresses such as column 1, column 2, column 4 and column 5 in a row on the memory cell 7, and the interval between column 0 and column 3 in a row on the memory cell 7 is the preset interval, namely 2. Since a storage failure between a plurality of memory cells 7 is generally a failure occurring between adjacent memory cells 7. Therefore, the storage failure between a plurality of memory cells 7 can be identified through spaced writing, reading and comparison. In the blocks in FIG. 7, a bold arrow represents writing in this word line, and a non-bold arrow represents not writing in this word line. From FIG. 7, when the test data is written in addresses such as column 0, column 4 and column 8 in a row on the memory cell 7, the test data is not written in addresses such as column 1, column 2, column 3, column 5, column 6 and column 7 in a row on the memory cell 7, and the interval between column 0 and column 4 in a row on the memory cell 7 is the preset interval, namely 3.

As shown in FIG. 3, each of W4CX_RS and W4CXB_RS represents a data set, and the two data sets represent a test data set and a preset test data set, respectively. When W4CX_RS is a preset test data set, W4CXB_RS is a test data set. Similarly, when W4CX_RS is a test data set, W4CXB_RS is a preset test data set. The data of the preset test data set is inverse to that of the test data set at the same bit line.

In this embodiment, the test system firstly acquires a preset test data set and then extracts first interval data from the preset test data set at a preset interval. For example, W4C0_RS is used as the preset test data set, and data 1010 is extracted for writing in the bit line BL 0. Data 1, 0, 1, and 0 are written in the memory cell 7 at locations of column and row 0, column 0 and row 1, column 0 and row 2, and column 0 and row 3 from top to bottom in the order of word lines WL0, WL1, WL2 and WL3, and the first interval data is orderly written in all the memory cells 7 to be tested at the preset interval of 3.

The test system reads the data in each memory cell 7 to be tested to obtain the preset voltage difference to be tested and thus completes the amplification preprocessing for the sense amplifier. There is no particular limitation on the operation mode of writing and reading data in this operation.

Subsequently, it is set in the TEST MODE (TM) of the memory that the first PMOS transistor 3 and the second PMOS transistor 4 are delayed to be switched on. The test system acquires a test data set and then extracts second interval data from the test data set at a preset interval. For example, W4C0B_RS is used as the test data set, and data 0101 is extracted for writing in the bit line BL 0. Data 0, 1, 0, 1 . . . are written, in Y-Page Write manner, in the memory cell at locations of column 0 and row 0, column 0 and row 1, column 0 and row 2, and column 0 and row 3 from top to bottom in the order of word lines WL0, WL1, WL2, WL3 . . . , and the second interval data is orderly written, in Y-Page manner, in all the memory cells 7 to be tested at the preset interval of 3.

It is set in the TEST MODE that a time threshold for delaying the switch-on of the first PMOS transistor 3 and the second PMOS transistor 4 and the shortest threshold of the shortened tRP are determined according to different models of products from different companies, which will not be particularly limited herein.

The Y-Page Write manner is a write operation mode in Y direction. Before the write operation is performed each time, a word line WL is opened. After all the memory cells 7 corresponding to this word line WL are orderly written, this word line WL is closed. Next word line WL is then opened, and all the memory cells 7 are orderly written.

Subsequently, with shortened tRP, the data in the memory cell 7 to be tested is read in X-Fast Read manner. Due to the shortened tRP, reading can be completed in the shortened tRP only in the X-Fast Read manner.

The X-Fast Read manner is a read operation mode in X direction. Before the read operation is performed each time, all word lines WL on the same bit line BL are orderly opened. After one word line WL is opened and the content in one burst length (8 bits) unit on this word line WL is orderly read, this word line WL is closed. Next word line WL is then opened and the content in one burst length unit on this word line WL is orderly read.

After the test system reads the data in all the memory cells 7, the preset voltage differences to be tested and the voltage differences to be tested are obtained, and then the first PMOS transistor 3 and the second PMOS transistor 4 are recovered to the normal operating state. The preset voltage differences to be tested and the voltage differences to be tested are used as data outputs in the form of "0" or "1". The test system browses the outputs of all the voltage differences to be tested and the preset voltage differences to be tested at the same memory cells 7, and determines that a mismatch occurs in the corresponding sense amplifier if the outputs are in the same direction.

The above process is a cycle of sense amplifier mismatch detection. After the completion of a cycle of detecting a mismatch of the sense amplifier corresponding to all the memory cells 7 to be tested, delaying the switch-on of the first PMOS transistor 3 and the second PMOS transistor is changed to delaying the switch-on of the first NMOS transistor 1 and the second NMOS transistor for a new cycle of testing until the test requirement is met.

Figure 8:
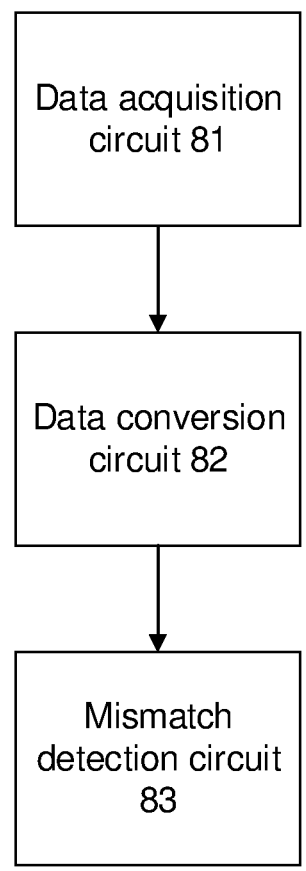
FIG. 8 is a structural schematic diagram of a system for detecting a mismatch of a sense amplifier according to an alternative embodiment of the present application.

The present application further provides a system for detecting a mismatch of a sense amplifier. FIG. 8 is a structural schematic diagram of a system for detecting a mismatch of a sense amplifier according to an alternative embodiment of the present application. The system includes:

a data acquisition circuit 81 configured to acquire a test data set;

a data conversion circuit 82 configured to convert the test data set into a first voltage difference between a bit line and a reference bit line, input the first voltage difference to a sense amplifier in which a PMOS transistor or an NMOS transistor is delayed to be switched on for precharge for a preset time which is less than a standard tRP, and amplify a second voltage difference between the bit line and the reference bit line obtained after the precharge by the sense amplifier to obtain a voltage difference to be tested; and a mismatch detection circuit 83 configured to compare the voltage difference to be tested with a preset voltage difference to be tested, and determine that a mismatch occurs in the sense amplifier if the voltage difference to be tested and the preset voltage difference to be tested are in a same direction.

The data acquisition circuit 81 is further configured to acquire a preset test data set before acquiring the test data set.

The data conversion circuit 82 is further configured to convert the preset test data set into a third voltage difference between the bit line and the reference bit line, input the third voltage difference to the sense amplifier with MOS transistors being switched on normally for precharge for the standard tRP, and amplify a fourth voltage difference between the bit line and the reference bit line obtained after the precharge by the sense amplifier to obtain the preset voltage difference to be tested, where the data of the preset test data set is inverse to that of the test data set at the corresponding bit line where the data is written.

The functions and implementation modes of the circuits in the above embodiment of the present application are identical to those described in the above embodiments of the method for detecting a mismatch of a sense amplifier. See the embodiments of the method for detecting a mismatch of a sense amplifier for details, which will not be redundantly described here.

The foregoing are merely descriptions of the preferred embodiments of the present application. It should be noted that improvements and modifications can be made by those of ordinary skill in the art without departing from the principles of the present application, and these improvements and modifications should also be considered as falling within the protection scope of the present application.

The invention claimed is:

1. A method for detecting a mismatch of a sense amplifier, comprising:

acquiring a test data set;

converting the test data set into a first voltage difference between a bit line and a reference bit line, and inputting the first voltage difference to a sense amplifier in which a positive channel-metal-oxide-semiconductor (PMOS) transistor or a negative channel-metal-oxide-semiconductor (NMOS) transistor is delayed to be switched on for precharge for a preset time, with the preset time being less than a standard precharge command period;

amplifying a second voltage difference between the bit line and the reference bit line obtained after the precharge by the sense amplifier to obtain a voltage difference to be tested; and comparing the voltage difference to be tested with a preset voltage difference to be tested, and determining that a mismatch occurs in the sense amplifier when the voltage difference to be tested and the preset voltage difference to be tested are in a same direction.

2. The method for detecting the mismatch of the sense amplifier according to claim 1, before the acquiring a test data set, further comprising:

acquiring a preset test data set, converting the preset test data set into a third voltage difference between the bit line and the reference bit line, inputting the third voltage difference to the sense amplifier with metal-oxide-semiconductor (MOS) transistors being switched on normally for precharge for the standard precharge command period, and amplifying a fourth voltage difference between the bit line and the reference bit line obtained after the precharge by the sense amplifier to obtain the preset voltage difference to be tested.

3. The method for detecting the mismatch of the sense amplifier according to claim 2, wherein data of the preset test data set is inverse to data of the test data set at the corresponding bit line wherein the data is written.

4. The method for detecting the mismatch of the sense amplifier according to claim 1, wherein the converting the test data set into a first voltage difference between a bit line and a reference bit line comprises:

writing the test data set in a memory cell to be tested, and converting the test data set into the first voltage difference between the bit line and the reference bit line by the memory cell to be tested.

5. The method for detecting the mismatch of the sense amplifier according to claim 4, wherein the writing the test data set in a memory cell to be tested and converting the test data set into the first voltage difference between the bit line and the reference bit line by the memory cell to be tested comprises:

after orderly writing the test data set in the memory cell to be tested at a preset interval, reading the first voltage difference between the bit line and the reference bit line from the memory cell to be tested according to the test data set.

6. The method for detecting the mismatch of the sense amplifier according to claim 5, wherein the orderly writing the test data set in the memory cell to be tested at a preset interval comprises:

extracting first interval data from the test data set at the preset interval, and orderly writing the first interval data in all the memory cells to be tested at the preset interval.

7. The method for detecting the mismatch of the sense amplifier according to claim 5, wherein the reading the first voltage difference between the bit line and the reference bit line from the memory cell to be tested according to the test data set comprises:

performing a read operation in X direction; before performing the read operation each time, orderly opening all word lines on a same bit line; opening one word line and orderly reading content of the memory cell to be tested in a burst length on the word line, and then closing the word line; and repeating the above operations until the read operation of the memory cell to be tested with at least one of the burst length is performed for all the word lines.

8. The method for detecting the mismatch of the sense amplifier according to claim 3, wherein the converting the preset test data set into a third voltage difference between the bit line and the reference bit line comprises:

writing the preset test data set in a memory cell to be tested, and converting the preset test data set into the third voltage difference between the bit line and the reference bit line by the memory cell to be tested.

9. The method for detecting the mismatch of the sense amplifier according to claim 8, wherein the writing the preset test data set in a memory cell to be tested and converting the preset test data set into the third voltage difference between the bit line and the reference bit line by the memory cell to be tested comprises:

after orderly writing the preset test data set in the memory cell to be tested at a preset interval, reading the third voltage difference between the bit line and the reference bit line from the memory cell to be tested according to the preset test data set.

10. The method for detecting the mismatch of the sense amplifier according to claim 9, wherein the orderly writing the preset test data set in the memory cell to be tested at a preset interval comprises:

extracting second interval data from the preset test data set at the preset interval, and orderly writing the second interval data in all the memory cells to be tested at the preset interval.

11. The method for detecting the mismatch of the sense amplifier according to claim 1, wherein the inputting a first voltage difference to a sense amplifier in which a PMOS transistor or an NMOS transistor is delayed to be switched on for precharge for a preset time and amplifying a second voltage difference obtained after the precharge by the sense amplifier to obtain a voltage difference to be tested specifically comprise:

inputting the first voltage difference to the sense amplifier in which the PMOS transistor or the NMOS transistor is delayed to be switched on for precharge for the preset time, and amplifying the second voltage difference obtained after the precharge by a sense-amplifying circuit of the sense amplifier to obtain the voltage difference to be tested, wherein a first NMOS transistor and a first PMOS transistor, and a second NMOS transistor and a second PMOS transistor in the sense-amplifying circuit of the sense amplifier form a complementary metal-oxide-semiconductor (CMOS) inverter, respectively.

12. A system for detecting a mismatch of a sense amplifier, comprising:

a data acquisition circuit configured to acquire a test data set;

a data conversion circuit configured to convert the test data set into a first voltage difference between a bit line and a reference bit line, input the first voltage difference to a sense amplifier in which a positive channel-metal-oxide-semiconductor (PMOS) transistor or a negative channel-metal-oxide-semiconductor (NMOS) transistor is delayed to be switched on for precharge for a preset time, with the preset time is less than a standard precharge command period, and amplify a second voltage difference between the bit line and the reference bit line obtained after the precharge by the sense amplifier to obtain a voltage difference to be tested; and a mismatch detection circuit configured to compare the voltage difference to be tested with a preset voltage difference to be tested, and determine that a mismatch occurs in the sense amplifier when the voltage difference to be tested and the preset voltage difference to be tested are in a same direction.

13. The system for detecting the mismatch of the sense amplifier according to claim 12, wherein the data acquisition circuit is further configured to acquire a preset test data set before acquiring the test data set.

* * * * *